(12) United States Patent
Reece et al.

(10) Patent No.: US 7,511,287 B2
(45) Date of Patent: Mar. 31, 2009

(54) SYSTEMS AND METHODS THAT MITIGATE CONTAMINATION AND MODIFY SURFACE CHARACTERISTICS DURING ION IMPLANTATION PROCESSES THROUGH THE INTRODUCTION OF GASES

(75) Inventors: Ronald N. Reece, Westwood, MA (US); Serguei I. Kondratenko, Swampscott, MA (US); Geumjoo Ra, North Andover, MA (US); Louis P. Wainwright, Beverly, MA (US); Gary N. Cai, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 487 days.

(21) Appl. No.: 11/273,039

(22) Filed: Nov. 14, 2005

(65) Prior Publication Data

US 2007/0075274 A1 Apr. 5, 2007

Related U.S. Application Data

(60) Provisional application No. 60/719,247, filed on Sep. 21, 2005.

(51) Int. Cl.
*H01J 37/36* (2006.01)
(52) U.S. Cl. .............................. 250/492.2; 250/492.21
(58) Field of Classification Search ............ 250/492.21, 250/492.2; 438/565; 315/111.21
See application file for complete search history.

(56) References Cited

U.S. PATENT DOCUMENTS

| | | | |
|---|---|---|---|
| 5,554,854 A * | 9/1996 | Blake | 250/492.21 |
| 6,525,326 B1 | 2/2003 | Harrington et al. | |
| 6,534,775 B1 | 3/2003 | Harrington et al. | |
| 6,639,227 B1 | 10/2003 | Glavish et al. | |
| 6,730,904 B1 * | 5/2004 | Wells | 250/292 |
| 6,770,117 B2 * | 8/2004 | Olander | 95/67 |

(Continued)

FOREIGN PATENT DOCUMENTS

EP 1 052 676 A2 11/2000

(Continued)

OTHER PUBLICATIONS

International Search Report, Int'l Application No. PCT/US2006/044036, Int'l Filing Date Nov. 10, 2006, 3 pgs.

*Primary Examiner*—Nikita Wells
*Assistant Examiner*—Johnnie L Smith, II
(74) *Attorney, Agent, or Firm*—Eschweiler & Associates, LLC

(57) ABSTRACT

A contamination mitigation or surface modification system for ion implantation processes includes a gas source, a controller, a valve, and a process chamber. The gas source provides delivery of a gas, be it atmospheric or reactive, to the valve and is controlled by the controller. The valve is located on or about the process chamber and controllably adjusts flow rate and/or composition of the gas to the process chamber. The process chamber holds a target device, such as a target wafer and permits interaction of the gas with an ion beam to mitigate contamination of the target wafer and/or to modify the existing properties of the processing environment or target device to change a physical or chemical state or characteristic thereof. The controller selects and adjusts composition of the gas and flow rate according to contaminants present within the ion beam, or lack thereof, as well total or partial pressure analysis.

27 Claims, 6 Drawing Sheets

U.S. PATENT DOCUMENTS

| | | | |
|---|---|---|---|
| 6,890,861 B1 | 5/2005 | Bosch | |
| 6,926,783 B2 * | 8/2005 | Loucks, Jr. | 156/73.6 |
| 7,037,813 B2 * | 5/2006 | Collins et al. | 438/510 |
| 7,064,491 B2 * | 6/2006 | Horsky et al. | 315/111.81 |
| 7,107,929 B2 * | 9/2006 | Horsky et al. | 118/723 CB |
| 7,137,354 B2 * | 11/2006 | Collins et al. | 118/723 IR |

FOREIGN PATENT DOCUMENTS

| | | |
|---|---|---|
| EP | 1 054 438 A2 | 11/2000 |
| WO | WO 99/31712 A1 | 6/1999 |

* cited by examiner

US 7,511,287 B2

SYSTEMS AND METHODS THAT MITIGATE CONTAMINATION AND MODIFY SURFACE CHARACTERISTICS DURING ION IMPLANTATION PROCESSES THROUGH THE INTRODUCTION OF GASES

RELATED APPLICATION

This application claims the priority of U.S. Provisional Application Ser. No. 60/719,247, filed Sep. 21, 2005, entitled SYSTEMS AND METHODS THAT MITIGATE CONTAMINATION DURING ION IMPLANTATION PROCESSES THROUGH THE INTRODUCTION OF REACTIVE GASES.

FIELD OF INVENTION

The present invention relates generally to ion implantation typically employed in semiconductor device fabrication, and more particularly, to mitigating contamination and/or modifying the surface characteristics of target devices through the introduction of gases during ion implantation.

BACKGROUND OF THE INVENTION

Ion implantation is, typically, a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system is employed to accelerate or decelerate the desired dopant ions to a predetermined momentum (e.g., mass of a dopant ion multiplied by its velocity) to penetrate the wafer surface. For acceleration, the system is generally of a linear design with annular powered electrodes along its axis. As the dopant ions enter therein, they are accelerated there through.

An end station holds one or more target wafers into which an ion beam from the acceleration system implants one or more dopants. The end station is operable to move or scan the one or more target wafers in one or two dimensions as the ion beam strikes the target wafer(s) in order to obtain desired coverage of the target wafer and dose amount in accordance with a prescribed ion implantation process.

One problem that can occur during the ion implantation process is the unwanted introduction of atomic or molecular contaminant particles into the ion beam. These contaminant particles can be introduced into the beam at various stages of the system, such as within the mass analysis subsystem, the acceleration electrodes and/or the end station. These particles can be undesirably implanted into, or deposited onto, one or more target wafers, resulting in degradation or failure of devices formed thereon.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention discloses methods and systems that mitigate contamination and/or modify surface characteristics during ion implantation processes by introduction of atmospheric or reactive gases during the ion implantation process. It has been discovered that these introduced gas(es) can prevent or mitigate contaminants from being implanted into target devices, such as silicon wafers by one or more mechanisms. While not intending to be confined by theory, it is assumed that one of the mechanisms is the formation of gaseous volatile compounds by the reactive gas, which interact with the contaminants at the target surface, whereby the volatile compounds are then removed by, for example, a cryogenic or turbo-molecular pump. Another mechanism involves the formation of a surface layer, such as a passivation layer, created by the presence of the reactive gas during ion implantation. The surface layer mitigates or prevents implanting of contaminants into underlying layers of the device.

In accordance with one aspect of the present invention, a contamination mitigation system for ion implantation processes includes a process chamber having a gas source/supply, a controller, and a valve coupled thereto. The gas source, for example, a pressurized gas cylinder, delivers a reactive gas to the process chamber via a valve that is selectively operated by the controller. The valve is located on or about the process chamber and controllably adjusts flow rate and/or composition of the gas(es) delivered to the process chamber. The process chamber holds a target device, such as a target wafer such that the gas(es) is permitted to interact with the ion beam or the wafer surface to mitigate contamination of the target wafer. In one embodiment, the controller can select and adjust the composition of the reactive gas as well as the flow rate according to monitored contaminants present within the ion beam or on the surface of the device or target. Other systems, methods, and detectors are also disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
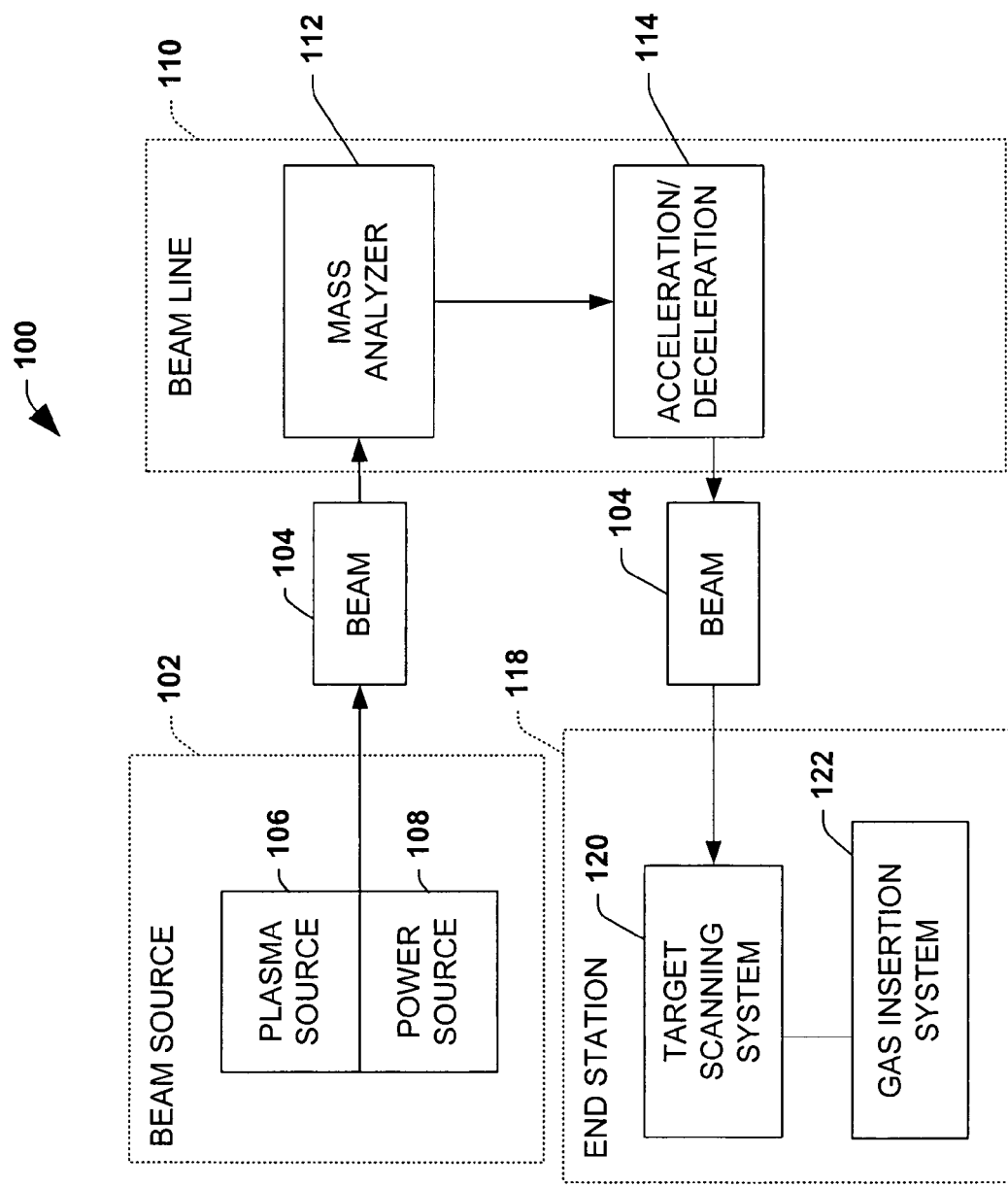
FIG. 1 is a block diagram of an ion implantation system in accordance with one or more aspects of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

As semiconductor devices, such as sub-micron CMOS structures, become smaller and smaller, the ion implantation processes required to modify electrically active regions of semiconductor devices become shallower and more sensitive to the material properties in the surface and near surface regions of the semiconductor devices. Additionally, semiconductor devices are more sensitive to surface contamination from sputtered materials and absorbed gases present during implantation processes, particularly the concentration and distribution of contaminants within active device regions. Contaminants or particles can be implanted with the ion beam and negatively impact diffusion and other properties of formed structures and/or devices. As a result, for example, this contamination can result in undesirable and varied device parameters for fabricated semiconductor devices.

Particles or atomic contaminants, which are also referred to later as ion beam contaminants, can arise for a variety of sources during ion implantation. For example, carbon can be generated from apertures and other surfaces within the ion implantation system. Typically, the carbon particles are generated by ion beam striking carbon based surfaces such as graphite, which is a commonly used material within ion implantation systems. Additionally, sputtering processes and other deposition mechanisms can release unwanted carbon particles. Additionally, photoresist material, which is commonly used as a mask for ion implantation typically, contains carbon, which can then be released during ion implantation. Although carbon is provided as an example of a type of particle or contaminant, contamination from other materials or types of particles or contaminants is contemplated by the present invention.

Aspects of the present invention mitigate contamination during ion implantation by employing a reactive gas, such as an atmospheric gas, oxygen containing gas, water vapor, and the like, that reacts with contaminants or particles in order to reduce contamination. Additionally, the reactive gas can also be used to modify the target properties or characteristics determined by previous processes.

Referring initially to FIG. 1, an ion implantation system 100 suitable for implementing one or more aspects of the present invention is depicted in block diagram form. The system 100 includes an ion source 102 for producing an ion beam 104 along a beam path. The ion beam source 102 includes, for example, a plasma source 106 with an associated power source 108. The plasma source 106 may, for example, comprise a relatively long plasma confinement chamber from which an ion beam is extracted.

A beam line assembly 110 is provided downstream of the ion source 102 to receive the beam 104 there from. The beam line assembly 110 includes a mass analyzer 112, and an acceleration structure 114, which may include, for example, one or more gaps. The beam line assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The acceleration gap or gaps within the acceleration structure 114 are operable to accelerate and/or decelerate ions within the beam to achieve a desired depth of implantation in a work piece. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means may be applied before as well as after the magnetic analysis by the mass analyzer 112.

An end station 118 is also provided in the system 100 to ion beam 104 from the beam line assembly 110. The end station 118 supports one or more work pieces, such as semiconductor wafers (not shown), within a process chamber and along the beam path for implantation using the mass analyzed ion beam 104. The end station 118 includes a target scanning system 120 for translating or scanning one or more target work pieces and the ion beam 104 relative to one another. The target scanning system 120 may provide for batch or serial implantation, for example, as may be desired under given circumstances, operating parameters and/or objectives.

Particles or atomic contaminants can enter the ion beam 104 during ion implantation that, if implanted, can damage or degrade operation of semiconductor devices formed on the one or more work pieces. The particles or atomic contaminants arise for a variety of sources during ion implantation. For example, carbon can be generated from apertures and other surfaces within the acceleration structure 114. Typically, the carbon particles are generated by ion beam striking carbon based surfaces such as graphite, which is a commonly used material within ion implantation systems. Additionally, sputtering processes and other deposition mechanisms can release unwanted carbon particles. Additionally, photoresist material, which is commonly used as a mask for ion implantation typically, contains carbon, which can then be released during ion implantation. Although carbon is provided as an example of a type of particle or contaminant, contamination from other materials or types of particles or contaminants is contemplated by the present invention.

A gas insertion system 122 is also included within the end station 118 and inserts a gas, such as a reactive or atmospheric gas, that mitigates contamination of the one or more work pieces during ion implantation. The gas reacts with contaminants or particles within the ion beam 104 in order to reduce contamination. The gas can react with the contaminants in by a number of mechanisms to reduce contamination of the work pieces and remove the particles or atomic contaminants from the ion beam 104.

In one mechanism, the gas can form a passivation layer on a top surface of a target semiconductor devices formed on the one or more work pieces by interacting with the ion beam 104. The passivation layer 104 can reduce contaminants from passing through to underlying layers and/or mitigate out diffusion of dopants during later fabrication steps. The passivation layer can be comprised of, for example, oxide, nitride, and the like and can be formed by an ion beam enhanced formation process. The passivation layer is formed by a process that is facilitated by the ion implantation and the presence of the reactive gas. For example, an ion beam destroys at least some of the surface bonds of silicon, which results in the silicon having a higher probability of forming an oxide. Then, by supplying an oxygen or water vapor containing gas during the ion implantation, oxide is more readily formed as a passivation layer. The passivation layer can then act as a diffusion barrier to mitigate out diffusion during later fabrication steps.

Another mechanism to reduce contamination is by employing a gas for consuming contaminants, such as carbon, that would otherwise be absorbed on the surface and driven into the material by the ion beam. The gas or components within the gas can react with the contaminants and form compounds that do not get implanted and/or can be swept away. For example, formation of volatile compounds or gaseous compounds, CO for example, can be readily pumped away or removed by a high vacuum system. This reduces or removes contaminants or particles that could be driven into target semiconductor devices.

Figure 2:
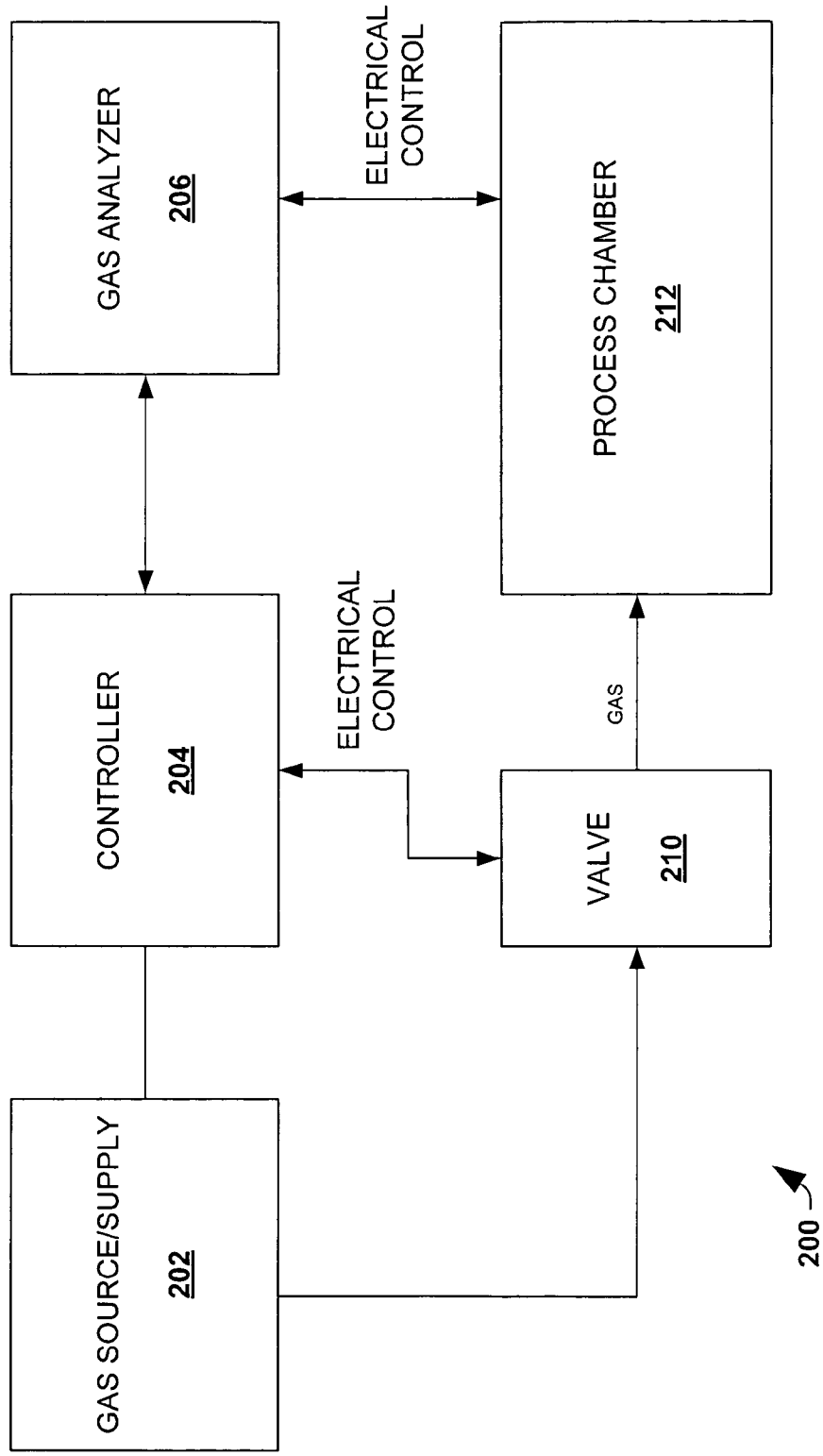
FIG. 2 is a block diagram of an ion implantation process modification system in accordance with an aspect of the present invention.

Referring initially to FIG. 2, an ion implantation process modification system 200 is described in accordance with an aspect of the present invention. The system 200 modifies a current ion implantation process by introducing atmospheric and/or reactive gases during the ion implantation process for the modification and control of material properties resulting from the ion implantation process. The system 200 can be employed, for example, with single wafer ion implantation systems, batch ion implantation systems, plasma immersion ion implantation systems and the like.

The system 200 includes a gas source/supply 202, a controller 204, a gas analyzer 206, a controllable valve 210, and a process chamber. The gas source/supply 202 is a mechanism that controllably delivers a gas, such as atmospheric or reactive gas, to the process chamber 212 through a controllable valve 210. The gas is comprised of one or more individual atmospheric and/or reactive gases. The gas source/supply 202, in one example, is comprised of one or more gas cylinders, an evaporation or sublimation system, and/or atmospheric inlet (not shown). The gas cylinder contains a reactive gas or vapor at a pressure high enough to provide a required gas flow via the controllable valve 210 to the process chamber 212. The evaporating system is comprised of water or any other liquid or solid material to generate a reactive gas vapor. In another example, the gas source/supply 202 comprises a source reservoir containing a reactive material in liquid or solid form capable of being evaporated or sublimated at a pressure sufficient to provide the gas. The valve 210 comprises one or more individual valves for selecting flow rate and composition of the reactive gas ultimately provided to the process chamber. The valve 210 is controlled by the controller 204, which adjusts the flow rate and composition of the reactive gas in order to facilitate removal of contaminants or particles and to mitigate contamination of a target semiconductor device (not shown) within the process chamber 212.

The process chamber 212 is part of an end station of an ion implantation system, which can be a single wafer and/or batch ion implantation system. The process chamber 212 holds or supports one or more target devices, such as target wafers, for ion implantation. An ion beam, generated as part of the ion implantation system, enters the process chamber 212 and implants dopants within the ion beam into the target device(s). Typically, the ion beam and/or the process chamber include undesired particles or contaminants that result in contamination of the target devices, as described above.

The reactive gas enters the process chamber 212 via the valve 210 and interacts with the ion beam to mitigate contamination of the target device(s) by the particles or contaminants. The reactive gas employed is selected according to a type or composition of expected particles or contaminants. Some examples of suitable gases that can be employed include atmospheric gases, such as oxygen, nitrogen, water vapor, and the like. However, other reactant gases can also be employed. The gas can react with the contaminants in by a number of mechanisms to reduce contamination, such as combining with the contaminants and becoming volatile and then removed by vacuum pumping and/or creating a surface condition that prevents or mitigates particles from being implanted beyond or about the created surface condition.

As one example of a suitable mechanism, the gas can form a passivation layer on a top surface of a target semiconductor device by interacting with the ion beam. The passivation layer can be formed by an ion beam enhanced formation process. For example, ions or dopants within the ion beam can increase the propensity of surface silicon to react with one or more materials within the reactive gas, thereby forming the passivation layer as a result. The passivation layer can then act as a diffusion barrier to mitigate out diffusion during later fabrication steps and may mitigate particles or contaminants from being implanted into the target device(s). Surface reactions with previously deposited material or contaminants may be modified or enhanced as well.

Another example of a suitable mechanism to reduce contamination is by employing the reactive gas for consuming particles or contaminants, such as carbon, that would otherwise be absorbed on the surface and driven into the material by the ion beam. The gas or components within the gas can react with the contaminants and form compounds that do not get implanted and/or can be swept away. For example, formation of volatile compounds or gaseous compounds can be readily pumped away or removed by a high vacuum system. This reduces or removes contaminants or particles that could be driven into target semiconductor device(s).

The gas analyzer 206 is a residual gas analyzer that analyzes background gases present within the ion implantation chamber 212. The gas analyzer 206 generates feedback or a feedback signal for the controller 204 to adjust or control the flow rate of the reactive gases or rate of introduction and/or the reactive gas composition so as to facilitate removal of the contaminants or particles from the ion beam and/or target surface. It is noted that alternate aspects can omit employment of the gas analyzer 206 and still be in accordance with the present invention.

The controller 204 initially sets the reactive gas composition and flow rate according to process conditions, such as expected contaminant compositions and amount during a particular ion implantation process. The controller 204 adjusts the gas source 202 to supply the reactive gas and adjusts the valve 210 to control flow rate and/or composition of the reactive gas. The controller 204 receives and analyzes the generated feedback from the gas analyzer 206 during ion implantation and determines whether or not corrective adjustments are required. The controller 204 can then perform the corrective adjustments that facilitate removal of contaminants and mitigate contamination, such as by adjusting the reactive gas composition and/or by adjusting the flow rate of the reactive gas to obtain a desired pressure within the process chamber 212.

Figure 3:
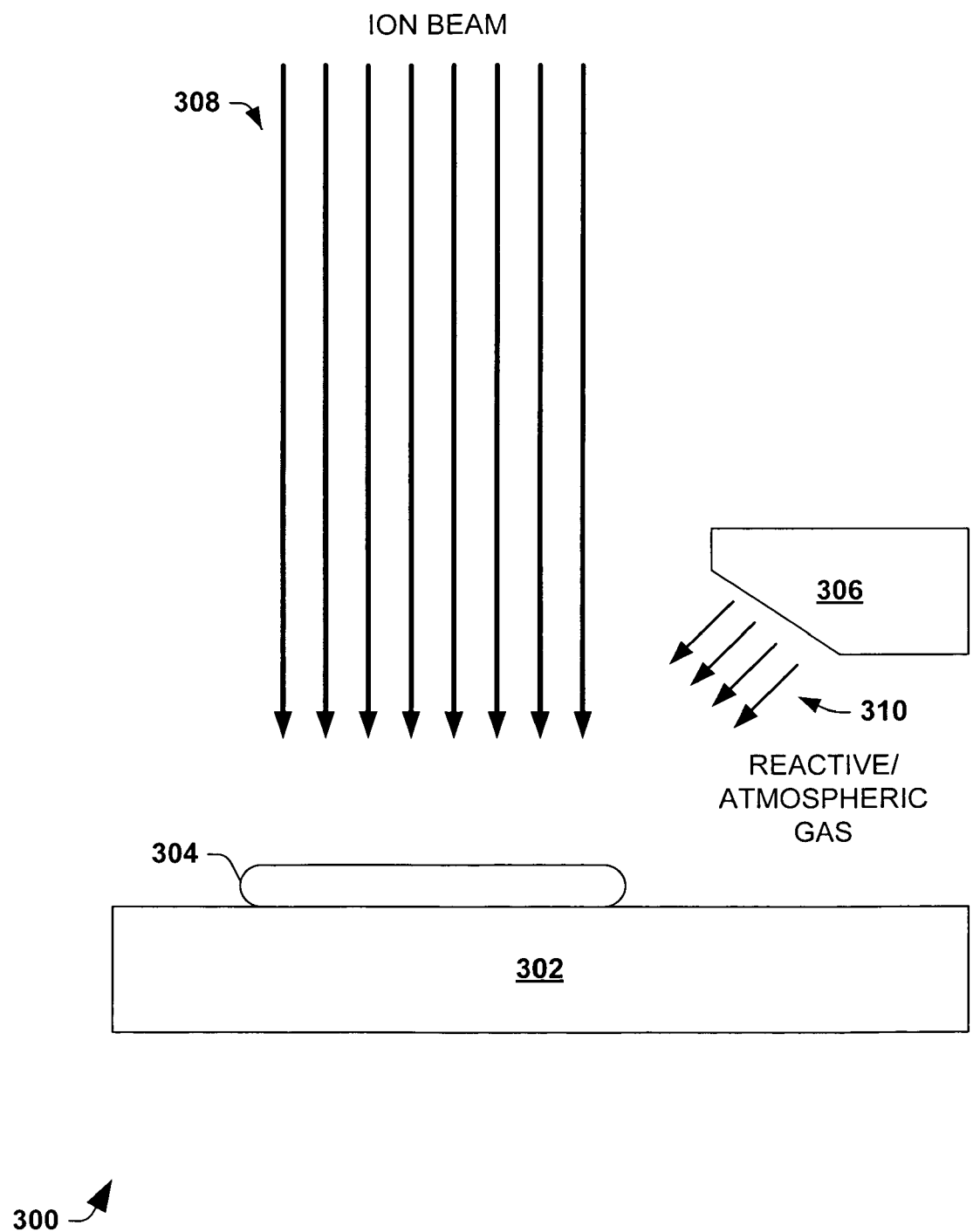
FIG. 3 is a block diagram depicting an interior of a process chamber during an ion implantation process in which a reactive gas in introduced to mitigate contamination in accordance with an aspect of the present invention.

FIG. 3 is a block diagram depicting an interior of a process chamber 300 during an ion implantation process in which a gas, such as a reactive or atmospheric gas, is introduced to mitigate contamination in accordance with an aspect of the present invention. This diagram is presented to further illustrate interaction of the reactive gas with contaminants during ion implantation and is not intended to limit the invention to particular structures or arrangements.

The process chamber 300 includes a target device support structure 302 that supports a target wafer 304. The structure 302 can be a process disk for a batch ion implantation system or a single wafer holder for a single wafer ion implantation system. The target wafer 304 is undergoing an ion implantation process, such as one implanting p-type or n-type dopants to form active regions. The target wafer 304 can be at one of a number of stages of fabrication.

A gas inlet or valve 306 controllably supplies a gas 310 to be in close proximity to the target wafer 304. The gas 310, such as an atmospheric or reactive gas, is typically supplied about or near a surface of the target wafer 304 wherein the ion beam 308 is in contact, in this example. The inlet 306 can control the amount or flow rate of the reactive gas 310 and may, in some aspects, control or adjust composition of the reactive gas. The ion beam 308 comprises selected dopants or ions to be implanted and has a beam energy and current density in order to obtain a desired depth and/or concentration for implant on the target wafer 304. Generally, the ion beam 308 or surrounding portions of the process chamber 300 include unwanted particles or atomic contaminants. The gas 310 can mitigate contamination of the target wafer 304 by a number of mechanisms. One such mechanism is for the gas 310 to combine with the particles or contaminants to form compounds, which are then removed from the process chamber by, for example, a vacuum pump. Another mechanism is to form a passivation layer by an ion beam enhanced formation process that may also mitigate contamination of the target wafer 304 and also serves to facilitate diffusion during later fabrication processes. Other mechanisms that employ the gas 310 to mitigate contamination are also contemplated.

Figure 4:
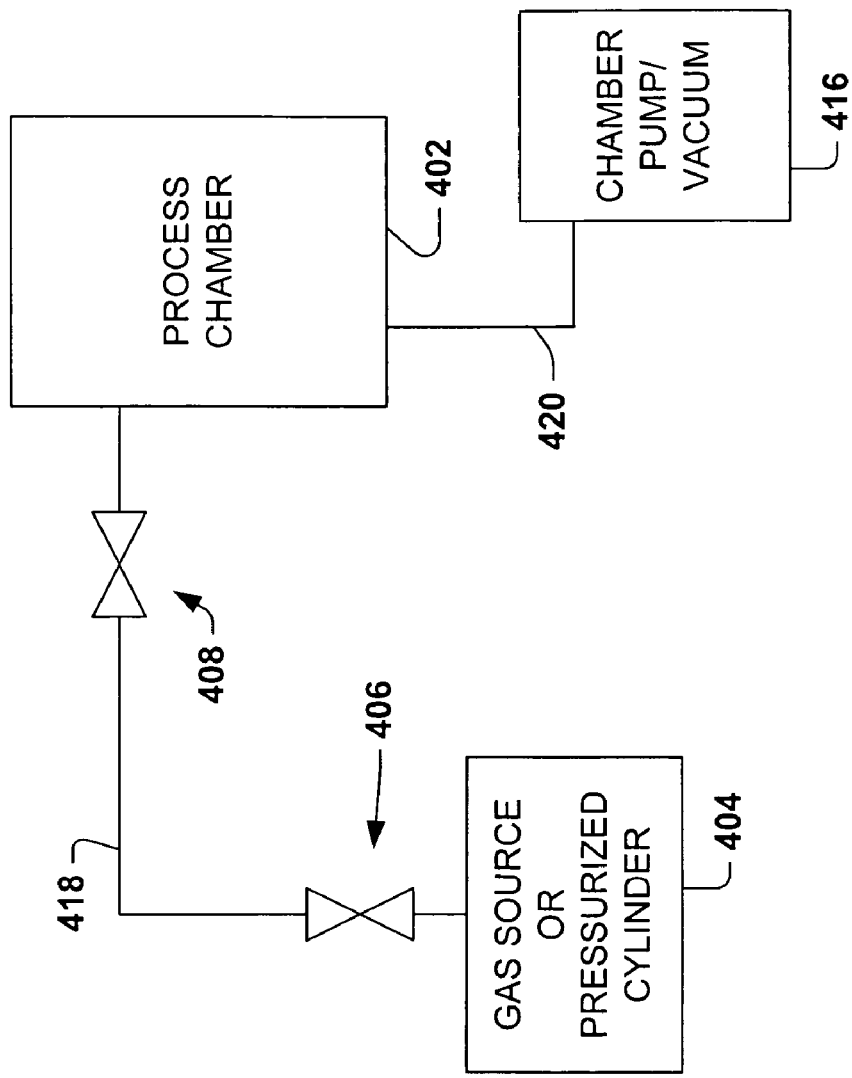
FIG. 4 is a diagram of an ion implantation process modification system is described in accordance with an aspect of the present invention.

FIG. 4 is a diagram of an ion implantation process modification system 400 in accordance with an aspect of the present invention. The system 400 is provided for exemplary purposes and modifies a current ion implantation process by introducing atmospheric and/or reactive gases during the ion implantation process for the modification and control of material properties resulting from the ion implantation process. The system 400 can be employed, for example, with single wafer ion implantation systems, batch ion implantation systems, plasma immersion ion implantation systems and the like.

The system 400 includes a gas source or cylinder 404, a process chamber 402, and a chamber vacuum pump 416. The gas source or cylinder 404 is a mechanism that controllably delivers gas, such as reactive or atmospheric gas, to the process chamber 402 through a controllable valve 408. A gas source, such as a reservoir, or cylinder valve 406 is employed to control and/or adjust operation of the gas source or cylinder 404. A flow mechanism 418, such as a teflon line, connects the source valve 412 with a process chamber valve 408 and also with the gas source valve 406.

The process chamber valve 408 comprises one or more individual valves for selecting flow rate and composition of the gas ultimately provided to the process chamber. The valve 408 may be controlled by an external controller (not shown) or can be otherwise adjusted. The chamber valve 408 is generally set to adjust the flow rate and/or composition of the gas in order to facilitate removal of contaminants or particles and/or to mitigate contamination of a target semiconductor device (not shown) within the process chamber 402.

The process chamber 402 is part of an end station of an ion implantation system, which can be a single wafer and/or batch ion implantation system. The process chamber 402 holds or supports one or more target devices, such as target wafers, for ion implantation. An ion beam, generated as part of the ion implantation system, enters the process chamber 402 and implants dopants within the ion beam into the target device(s). Typically, the ion beam and/or the process chamber include undesired particles or contaminants that result in contamination of the target devices, as described above.

The vacuum chamber pump 416 is connected to the process chamber 402 via a vacuum line 420 and removes air/gas from the process chamber 402 in order to obtain a selected or desired atmospheric pressure and to remove gases from the chamber 402.

The gas enters the process chamber 402 via the chamber valve 408 and interacts with the ion beam to mitigate contamination of the target device(s) by the particles or atomic contaminants. The gas can react with the contaminants in or about the target device by a number of mechanisms to reduce contamination, such as those described above, or modify the surface of the target.

The chamber residual gas that can comprise at least a portion of the undesired particles or contaminants is then removed from the chamber by the vacuum pump 416 through the vacuum line 420.

Figure 5:
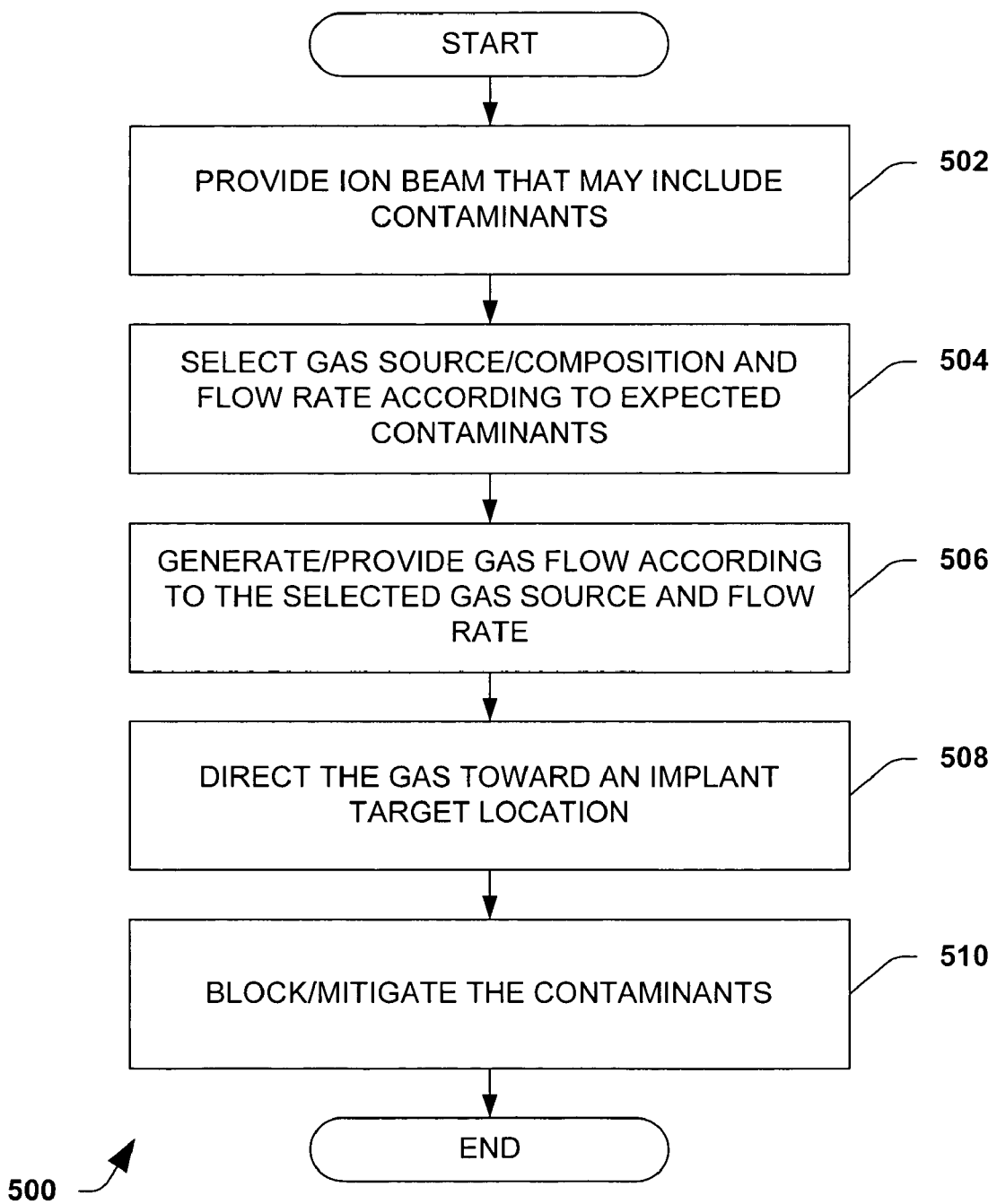
FIG. 5 is a flow diagram illustrating a method mitigating contamination of a target device by contaminants during ion implantation in accordance with an aspect of the present invention.

FIG. 5 is a flow diagram depicting a method 500 for mitigating contamination of a target device by contaminants during ion implantation by introducing a gas, such as a reactive or atmospheric gas, near a surface of the target device in accordance with an aspect of the present invention. The method 500 can be employed in single and/or batch ion implantation systems.

It is appreciated that the method 500, as well as variations thereof, can be further appreciated with reference to other figures of the present invention. Additionally, the method 500 and description thereof can also be employed to facilitate a better understanding of other aspects of the invention described above.

While, for purposes of simplicity of explanation, the method 500 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect of the present invention.

The method 500 begins at block 502 wherein an ion beam that may comprise contaminants is provided. The ion beam is provided, typically as part of an ion implantation system comprising an ion source, mass analyzer, and a beam line assembly. The ion beam undesirably can comprise contaminants, such as carbon contaminants, that could damage and/or alter a target device without interaction by a reactive gas. The contaminants can be introduced into the beam at various stages of the ion implantation system. The ion beam comprises one or more selected dopants at a selected energy with a selected beam current.

A gas, such as an atmospheric or reactive gas, composition and flow rate are selected at block 504 according to process characteristics, such as expected contaminants. For example, a gas composition comprising oxygen or water vapor can be suitable for expected carbon contaminants. The flow rate is selected to obtain a desired pressure within the process chamber and permit interaction of the reactive gas and the contaminants.

The gas is generated at block 506 according to the selected composition and/or flow rate. In one example, one or more gas sources and/or reservoirs can be present as well as a gas cylinder, evaporating system, and/or atmospheric inlet that comprise potential source gases. The gas cylinder contains a gas or vapor at a pressure high enough to provide a required gas flow to the process chamber through the controllable valve. The evaporating system is comprised of water or any other liquid or solid material to generate a reactive gas vapor. One or more valves can be employed to facilitate selection of composition and to also adjust the flow rate.

The gas is directed toward an implant target location at block 508. Tube(s), line(s) and/or hose(s) comprised of suitable materials can be employed to carry the reactive gas from gas source(s) to the process chamber. An inlet or valve within or a part of the process chamber can be employed to direct the reactive gas proximate to the implant target location of the target device, wherein the ion beam is impacting that target location.

The gas reacts with the contaminants and/or mitigates contamination of the target location at block 510. The gas can, in one example, combine with the contaminants and become volatile. Subsequently, the volatile compounds are removed by pumping. In another example, the gas creates a surface condition, such as a passivation layer, that prevents or mitigates particles from being implanted beyond or about the created surface condition.

Figure 6:
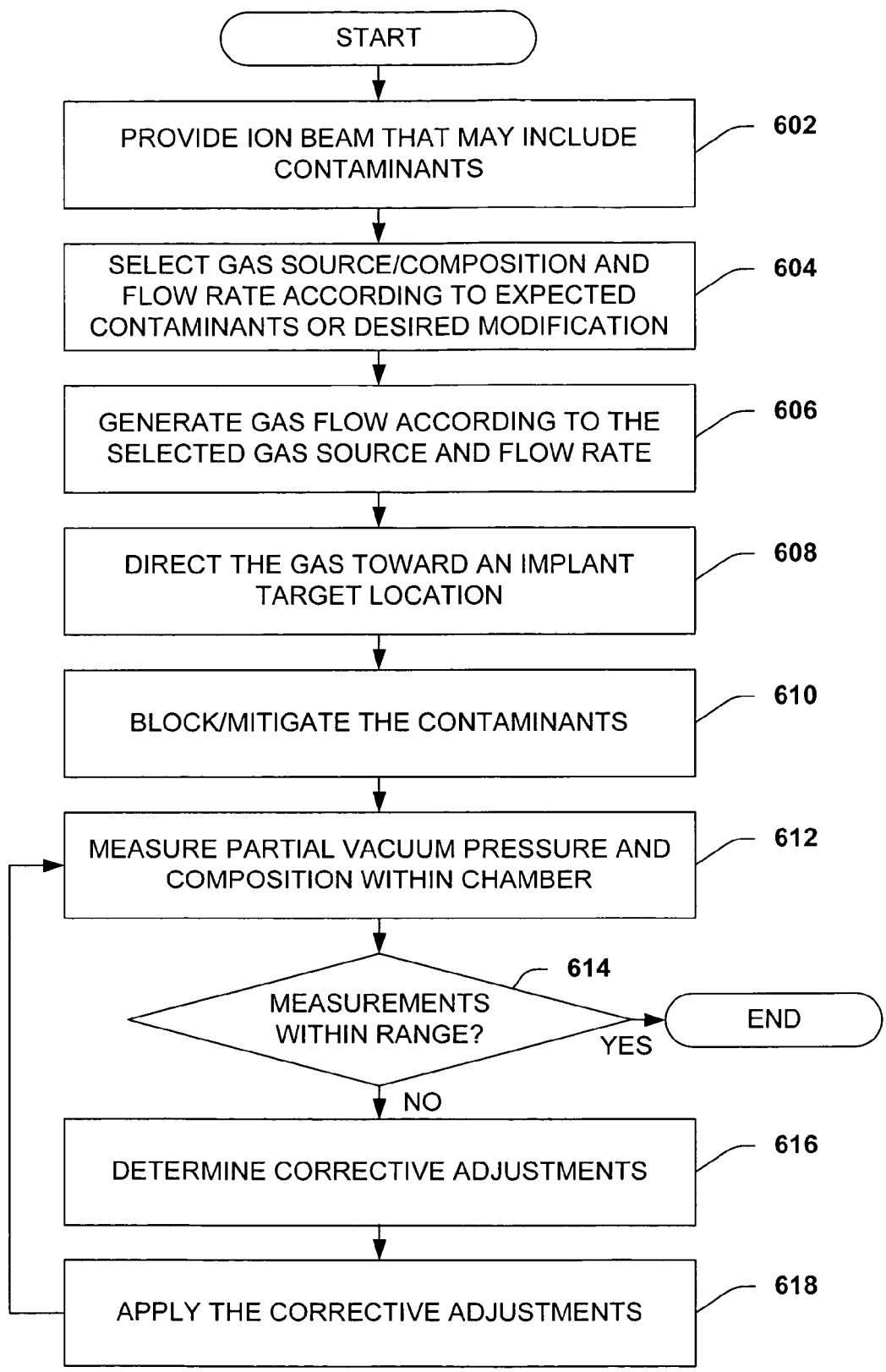
FIG. 6 is a flow diagram illustrating a method mitigating contamination of a target device by contaminants during ion implantation that introduces a reactive gas and measures gas within a process chamber during ion implantation in accordance with an aspect of the present invention.

FIG. 6 is a flow diagram depicting a method 600 for mitigating contamination of a target device by contaminants during ion implantation by introducing a gas, such as a reactive or atmospheric gas, near a surface of the target device in accordance with an aspect of the present invention. The method 600 can be employed in single and/or batch ion implantation systems.

It is appreciated that the method 600, as well as variations thereof, can be further appreciated with reference to other figures of the present invention. Additionally, the method 600 and description thereof can also be employed to facilitate a better understanding of other aspects of the invention described above.

While, for purposes of simplicity of explanation, the method 600 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method 600 begins at block 602 wherein an ion beam that may comprise contaminants is provided. The ion beam may comprise contaminants, such as carbon contaminants, that could damage and/or alter a target device without interaction by a reactive gas. These contaminants can be introduced at various stages of an ion implantation system that provides the ion beam. The ion beam comprises one or more selected dopants at a selected energy and dose.

An initial gas composition and flow rate are selected at block 604 according to process characteristics, such as expected contaminants. For example, a gas composition comprising oxygen or water vapor can be suitable for expected carbon contaminants. The flow rate is selected to obtain a desired pressure within the process chamber, permit interaction of the reactive gas and the contaminants, and remove volatile gases comprising the contaminants.

The gas is generated at block 606 according to the selected composition and/or flow rate. One or more gas sources can be presented as a gas cylinder, evaporating system, and/or atmospheric inlet that comprise potential source gases. The gas cylinder contains a reactive gas or vapor at a pressure high enough to provide a required gas flow to the process chamber through the controllable valve. The evaporating system is comprised of water or any other liquid or solid material to generate a reactive gas vapor. One or more valves can be employed to facilitate selection of composition and to also adjust the flow rate.

The gas is directed toward an implant target location at block 608. Tube(s), line(s) and/or hose(s) comprised of suitable materials can be employed to carry the gas from gas source(s) to the process chamber. An inlet or valve within or a part of the process chamber can be employed to direct the gas proximate to the implant target location of the target device, wherein the ion beam is impacting that target location.

The gas reacts with the contaminants and/or mitigates contamination of the target location at block 610. The gas can, in one example, combine with the contaminants and become volatile. Subsequently, the volatile compounds are removed, for example, by pumping. In another example, the reactive gas creates a surface condition, such as a passivation layer, that prevents or mitigates particles from being implanted beyond or about the created surface condition.

Gaseous partial pressures and composition are measured within the chamber at block 612. A reactive gas analyzer is typically employed to measure the composition of the air/gas within the chamber. The measurements can include contaminants present, total partial pressure or vacuum, reactive gas present, and the like.

If the measurements are outside of an acceptable range at block 614, corrective adjustments for flow rate and composition of the gas are determined at block 616. Additionally, the corrective adjustments can include a flow rate of exhaust gas from the process chamber.

Then, the gas composition and flow rate corrective adjustments are applied at block 618. Typically, the gas source and one or more controllable valves are employed to obtain the corrective adjustments. Subsequently, the method 600 returns to block 612 wherein new measurements are obtained.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Additionally, the term "exemplary" is intended to indicate an example and not to indicate superior or best. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion implantation system comprising:
   an ion source for generating an ion beam;
   a beam line assembly that directs the ion beam toward a target device;
   a process chamber containing the target device for receiving the ion beam; and
   a gas insertion system coupled to said process chamber for providing a gas input thereto,
   wherein said gas insertion system is operative to provide a gas into said process chamber proximate to the target device therein so as to mitigate contamination of the target device by contaminants, and/or modify the existing properties of a processing environment and/or the target device to change a physical or chemical state thereof.

2. The ion implantation system of claim 1, wherein said gas insertion system provides atmospheric gas to said process chamber.

3. The ion implantation system of claim 1, wherein said gas insertion system provides a reactive gas to said process chamber.

4. The system of claim 3, wherein the reactive gas comprises oxygen and/or water vapor.

5. The system of claim 1, wherein said gas insertion system further comprises:
   a source reservoir; and
   an inlet for delivering gas from said source reservoir to said process chamber.

6. The system of claim 5, wherein said source reservoir contains a reactive material in gas or vapor form at a pressure sufficient to provide a gas flow into said process chamber.

7. The system of claim 5, wherein said gas insertion system further comprises an evaporation or sublimation system coupled to said source reservoir, and said source reservoir contains a reactive material in liquid or solid form capable of being evaporated or sublimated at a pressure sufficient to provide a gas flow into said process chamber.

8. The system of claim 1, wherein said process chamber further comprises an inlet valve for selectively delivering the gas to said process chamber.

9. The system of claim 1, further comprising a vacuum pump that controllably removes exhaust gas from the process chamber.

10. The system of claim 1, further comprising a controller coupled to the gas insertion system that adjusts composition and flow rate of the gas.

11. The system of claim 10, further comprising a gas analyzer that measures partial vacuum pressure and/or composition within the process chamber and generates a feedback signal in accordance therewith.

12. The system of claim 11, wherein said controller adjusts the composition and/or the flow rate of the gas according to the feedback signal generated by the gas analyzer.

13. The system of claim 1, wherein the ion beam comprises a ribbon beam or a pencil beam.

14. The system of claim 1, wherein said process chamber comprises a target device handling system for delivering multiple target devices to the ion beam in a single batch.

15. The system of claim 1, wherein said process chamber comprises a target device handling system for delivering a single target device to the ion beam.

16. A process chamber comprising:
   a support structure that holds a target device;
   an opening defined within an enclosure that receives an ion beam containing contaminants and directed toward the target device; and
   an inlet valve for receiving a gas,
   wherein the inlet valve is operative to supply the gas proximate to the target device and within a path of the ion beam so as to mitigate contamination of the target device by the contaminants, and/or modify existing properties of a processing environment and/or the target device to change a physical or chemical state thereof.

17. The chamber of claim 16, further comprising a vacuum pump that controllably removes exhaust gas from the chamber.

18. The chamber of claim 17, wherein the gas combines with the contaminants of the ion beam and forms the exhaust gas that is removed by the exhaust valve.

19. The chamber of claim 16, wherein the gas is an atmospheric gas.

20. The chamber of claim 16, wherein the gas is a reactive gas.

21. A method of mitigating contamination by contaminants during ion implantation comprising:
   directing an ion beam containing contaminants toward an implant target location;
   selecting a gas composition and flow rate according to expected contaminants;
   providing the gas according to the selected reactive gas composition and the selected flow rate; and
   directing the gas toward the implant target location.

22. The method of claim 21, further comprising mitigating contamination of the implant target location by interacting the gas with the ion beam near the implant target location.

23. The method of claim 22, wherein interacting the gas with the ion beam comprises forming a passivation layer that blocks undesired implant of the contaminants.

24. The method of claim 22, wherein interacting the reactive gas with the ion beam comprises generating volatile compounds containing the contaminants and removing the volatile compounds from a process chamber.

25. The method of claim 21, further comprising measuring chamber gas proximate to the implant target location for presence of contaminants, reactive gas(es), and/or total partial pressure of residual gases.

26. The method of claim 25, further comprising determining corrective adjustments for the gas composition and the gas flow rate according to the measured presence of contaminants, reactive gas(es), and/or the measured total partial pressure of residual gases.

27. The method of claim 21, wherein providing the gas comprises providing a source reservoir containing a reactive material in liquid or solid form and evaporating or sublimating the reactive material to provide the gas.

* * * * *